United States Patent
Eldredge

(10) Patent No.: US 8,780,608 B2
(45) Date of Patent: Jul. 15, 2014

(54) APPARATUSES AND METHODS FOR READING AND/OR PROGRAMMING DATA IN MEMORY ARRAYS HAVING VARYING AVAILABLE STORAGE RANGES

(75) Inventor: Kenneth J. Eldredge, Boise, ID (US)

(73) Assignee: Micron Technology, Inc., Boise, ID (US)

(*) Notice: Subject to any disclaimer, the term of this patent is extended or adjusted under 35 U.S.C. 154(b) by 228 days.

(21) Appl. No.: 13/355,820

(22) Filed: Jan. 23, 2012

(65) Prior Publication Data

US 2013/0188413 A1   Jul. 25, 2013

(51) Int. Cl.
*G11C 11/00* (2006.01)
*G11C 7/00* (2006.01)

(52) U.S. Cl.
USPC ....... 365/148; 365/189.11; 365/158; 365/163

(58) Field of Classification Search
USPC .............................. 365/148, 189.11, 158, 163
See application file for complete search history.

(56) References Cited

U.S. PATENT DOCUMENTS

| 6,504,754 | B2 | 1/2003 | Tran et al. |
| 6,549,456 | B2 | 4/2003 | Werner et al. |
| 6,856,546 | B2 | 2/2005 | Guterman et al. |
| 7,881,100 | B2 * | 2/2011 | Ma et al. ................. 365/163 |
| 2009/0207642 | A1 * | 8/2009 | Shimano et al. ......... 365/72 |
| 2011/0188292 | A1 * | 8/2011 | Joo et al. ................. 365/148 |
| 2012/0120718 | A1 * | 5/2012 | Lou et al. ................. 365/158 |

* cited by examiner

*Primary Examiner* — Hoai V Ho
*Assistant Examiner* — Tri Hoang
(74) *Attorney, Agent, or Firm* — Pritzkau Patent Group, LLC

(57) ABSTRACT

Apparatuses and methods are disclosed, including methods for reading data from and programming data to an array of memory cells having varying available storage ranges. One such method involves determining a position of a determined value of a parameter within an available storage range of a selected memory cell of an array of memory cells.

30 Claims, 6 Drawing Sheets

APPARATUSES AND METHODS FOR READING AND/OR PROGRAMMING DATA IN MEMORY ARRAYS HAVING VARYING AVAILABLE STORAGE RANGES

BACKGROUND

The present application is related generally to the field of memory and, more particularly, apparatuses and methods for reading and programming data in memory having non-stable reference points.

Non-volatile memory (NVM) is electronic data storage that does not rely on a constant power source to maintain the storage of the data. NVM can be used in memory products such as USB flash drives, SD or microSD cards, MMC or others. NVM can utilize many different technologies including flash memory and magneto-resistive memory (MMR) which can commonly be referred to as magnetoresistive random access memory (MRAM).

Flash memory has cells which can be used as single level cells (SLC) or multi-level cells (MLC). In operation as a SLC, each cell will typically be in either an erased state or a programmed state, with each of those states corresponding to a different charge state. In operation as a MLC, each cell can be in an erased state, or one of multiple different programmed states, where each of the programmed states corresponds to a different charge state. Charging the cells to represent data can be referred to as programming the cells. Each of the different charge states in both the SLC and MLC, typically including the erase state, represent different data values.

In flash memory, there are typically multiple cells arranged to be programmed together which make up a page of cells and multiple pages of cells that are arranged to be erased together which make up a block of cells. Cells in flash memory are typically programmed in pages of cells and are erased in blocks of cells because of the architecture of the cells or how the cells are electrically connected. The cells in flash memory typically have approximately the same charge when erased and approximately the same charge when programmed to represent a specific data value. These charge levels can be considered to be reference points and in flash memory, since these reference points do not significantly vary from one cell to another, they can be considered to be stable reference points. Since flash memory has stable reference points, the range of available charges for all of the cells in the system is fairly well established and can be used to full advantage.

In contrast to flash other memory, including RRAM, ReRAM, and MRAM includes cells that utilize resistance in the cell to represent data. Cells can be read by determining the resistance to current flow through the cell. Read operations may involve using an analog-to-digital (A/D) converter to convert analog signals used in finding the resistance into digital signals used for representing the data. These memories can be useful over flash memory in that they are generally faster in operation and have less degradation over time.

These memories can be sensitive to how the cells are constructed. Small changes in the physical structure from one cell to the next can produce significant variances in operating characteristics between the cells. One such operating variance that has been particularly troublesome for the operation is the variation in the available range of resistances between different cells. This variation in the range of resistances can be described as non-stable reference points, since minimum resistance values, maximum resistance values and the magnitude of the available range of resistances (i.e., the difference between the minimum and maximum resistance values) can vary from one cell to the next.

One conventional method used for reading and writing (also called programming) to cells in these memories is to find a set value of resistance that falls within the different ranges of several of the cells and to define a datum value for all resistances below that set value and to define a different datum value for all resistances above that set value. Applicant recognizes that this method fails to take full advantage of the wide variety of values that can be stored in the memory cells instead utilizing the cells for only storing one of two different values at a time. Conventional efforts to use these memories cells for multiple value storage have focused on manufacturing the cells to higher standards to reduce variations between cells. However, since a few misplaced atoms during fabrication of the cell can cause variations in the performance of the cell, these efforts have not been entirely satisfactory.

The foregoing examples of the related art and limitations related therewith are intended to be illustrative and not exclusive. Other limitations of the related art will become apparent to those of skill in the art upon a reading of the specification and a study of the drawings.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiments shown, but is to be accorded the widest scope consistent with the principles and features described herein including modifications and equivalents, as defined within the scope of the appended claims. It is noted that the drawings are not to scale and are diagrammatic in nature in a way that is thought to best illustrate features of interest. Descriptive terminology may be adopted for purposes of enhancing the reader's understanding, with respect to the various views provided in the figures, and is in no way intended as being limiting.

Figure 1:
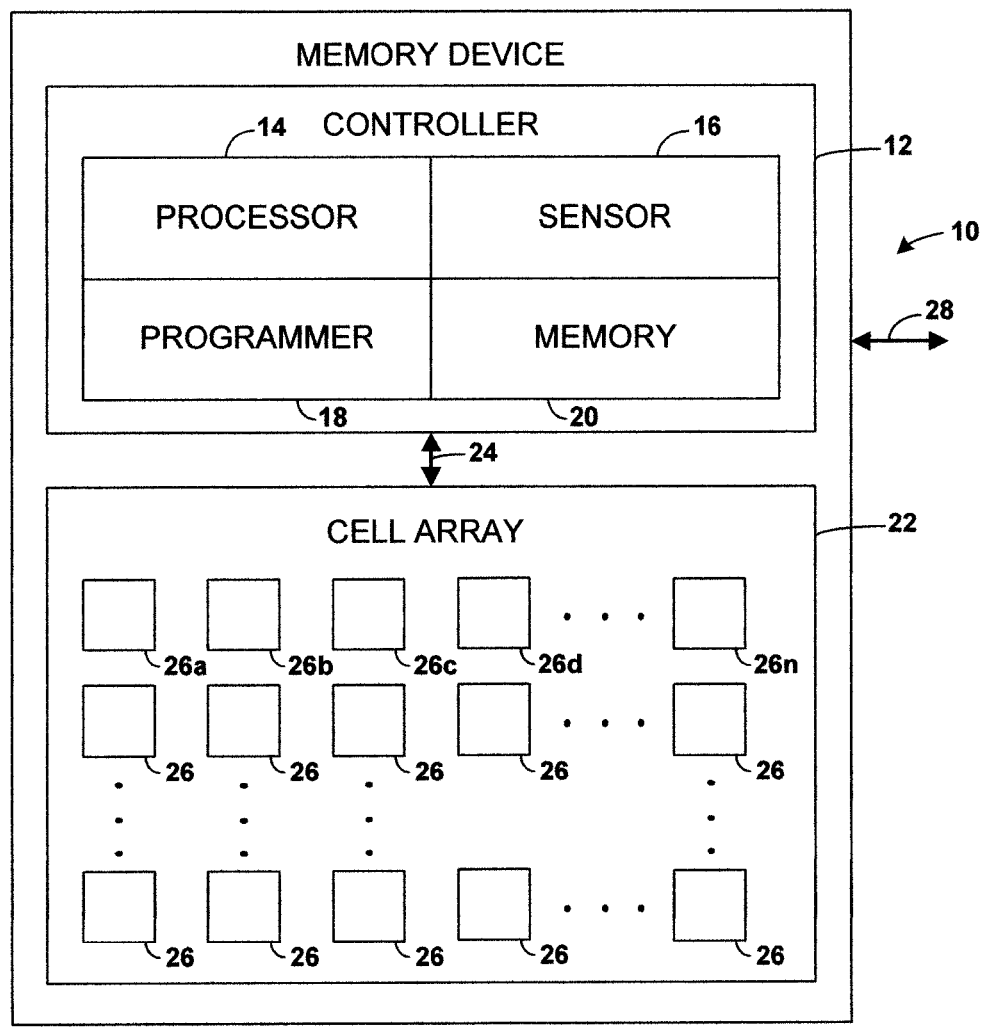
FIG. 1 is a block diagram which illustrates a memory device having memory cells with non-stable references that is arranged according to an embodiment of the present disclosure.

Attention is now directed to the figures wherein like items may refer to like components throughout the various views. FIG. 1 is a diagrammatic representation of an apparatus (e.g., a device or a system), produced according to an embodiment of the present disclosure, and generally indicated by the reference number 10. Apparatus 10 can be in the form of a memory device, as shown by example in FIG. 1, and can include a controller 12 (e.g., a stand-alone memory controller or control circuitry) which has a processor 14 (e.g., a microprocessor, application-specific integrated circuit, state machine, or the like), a sensor 16 (e.g., a sensing device, such as a sense amplifier), a programmer 18 (e.g., write circuitry) and a memory 20. Controller 12 can be coupled to a cell array 22 using a memory interface 24. In some embodiments, the controller 12 may be on the same substrate as the cell array 22, while in other embodiments the controller 12 may be on a different substrate than the cell array 22. Cell array 22 includes multiple cells 26. Specific cells "A", "B", "C", "D" and "n" are indicated by references numbers 26a, 26b, 26c, 26d, and 26n, respectively, and will be used for explanatory purposes. Other cells could be used for these purposes in addition to or in place of these cells. An apparatus interface 28 can be included for coupling (e.g., communicatively connecting) the apparatus 10 to another apparatus (e.g., other memory devices, controllers, and/or systems) that can operate with the apparatus 10 (e.g., utilize it for retrieving or storing data).

In the embodiment shown in FIG. 1 and by way of non-limiting example, the cells in cell array 22 are magnetoresistive random access memory (MRAM) cells that can each be programmed to exhibit a respective resistance within a respective available range of resistances to represent a datum value. In this embodiment, the resistance can be a specific instance of a parameter that can have a parameter value given in Ohms. The ranges used for storing data in the MRAM are ranges of resistances where the technology can have a potential parameter value range with a minimum potential parameter value and a maximum potential parameter value that can be the minimum and maximum resistances typically found in an array of MRAM memory cells.

Since MRAM can have available resistance ranges that vary from cell to cell, each cell has an available storage range that is within the potential parameter value range and which has actual minimum and maximum resistance values. Data is stored in the cell with a current parameter value, which in the present embodiment is a respective value of resistance that is within the available storage range of a selected cell. Since the maximum and minimum resistance values can vary from cell to cell, the MRAM can be referred to as having non-stable reference points. Maximum and minimum resistance values can be specific examples of maximum and minimum available parameter values which can be different for different technologies. The methods and apparatus disclosed herein can also be applied to other technologies such as, for example, PCRAM, RRAM and other memory cells either currently available or yet to be developed having storage ranges that vary or may be expected to vary, as is understood by a person of ordinary skill in the art. These other technologies can utilize different parameters (e.g., phase, current, charge and others) for representing data and can have different ranges which can be based on characteristics of the technology.

Sensor 16 can comprise a sense amplifier that includes an analog to digital (A/D) converter configured to determine the current (e.g., measured) parameter value, minimum available parameter value and maximum available parameter value. In embodiments where the memory cells are MRAM, PCRAM or other resistive type memory cell, the A/D converter can be configured to determine the current resistance value, the minimum resistance value and the maximum resistance value of a selected cell.

Figure 2:
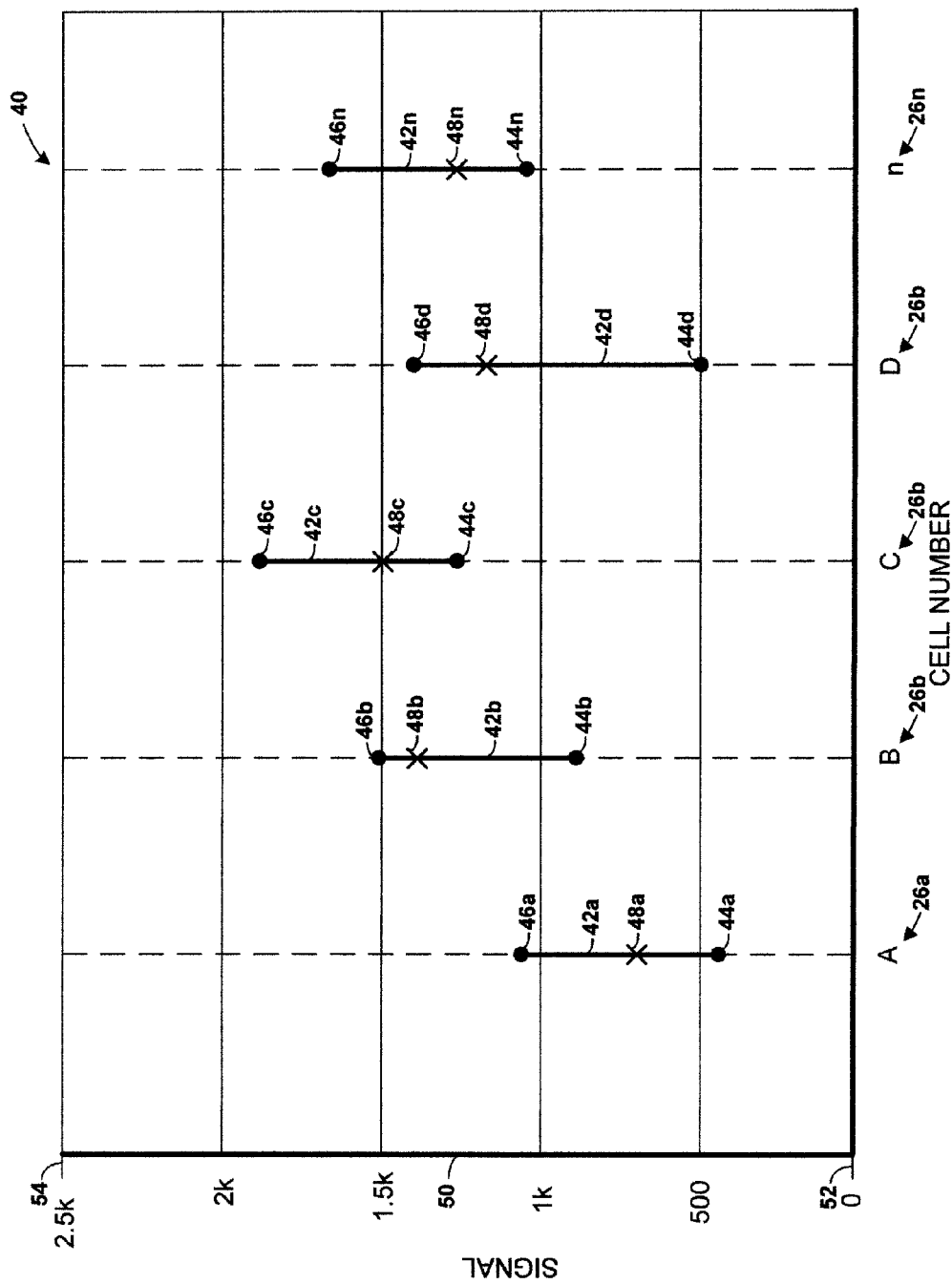
FIG. 2 is a graph illustrating different available storage ranges for a selected number of the memory cells shown in FIG. 1.

Now referring to FIG. 2 in conjunction with FIG. 1, a graph 40 illustrates specific available storage ranges for cells "A", "B", "C", "D" and "n" (26a, 26b, 26c, 26d and 26n in FIG. 1). Cell "A" has an available storage range 42a that extends from a minimum resistance value 44a to a maximum resistance value 46a. Minimum resistance value 44a is approximately 450 ohms and maximum resistance value 46a is approximately 1,100 k Ohms for cell "A", which makes range 42a exhibit a magnitude of approximately 650 Ohms. Cell "A" is programmed to a specific parameter value 48a that is about 650 Ohms. Cells "B", "C", "D" and "n" have available storage ranges 42b, 42c, 42d and 42n, respectively; minimum resistance values 44b, 44c, 44d and 44n, respectively; maximum resistance values 46b, 46c, 46d and 46n, respectively; and programmed parameter values 48b, 48c, 48d and 48n, respectively. In the embodiment shown, the cell array includes a potential parameter value range 50 having a minimum potential parameter value 52 of approximately 0 Ohms and a maximum potential parameter value 54 of approximately 2.5 k Ohms. The ranges shown in FIG. 2 are limited for purposes of explanation.

As is evident in FIG. 2, available storage ranges 42a to 42n vary in magnitude from cell to cell. Particularly evident is the difference in magnitude between cell "A" and cell "D". Cell "D" has an available storage range with a minimum resistance value of approximately 500 Ohms and a maximum resistance value of approximately 1.4 k Ohms. The available storage range in this embodiment is the difference between the maximum and minimum resistance values, which in cell "D" is 900 Ohms. As discussed above, cell "A" has a magnitude of approximately 650 Ohms, which is considerably less than cell "D". Cell ranges can vary in magnitude by several orders of magnitude.

As illustrated by FIG. 2, available storage range 42a of cell "A" and available storage range 42c of cell "C" do not have any common resistance values since minimum resistance value 44c of cell "C" is higher than the maximum resistance value 46a of cell "A". Because these available storage ranges do not overlap, the conventional system of defining a common resistance value within overlapping portions of available storage ranges as a threshold for all of the cells and representing one datum value with resistances above the threshold and another datum value with resistances below the threshold represents an impractical solution for these two cells. In this instance, either cell "A" or cell "C" may have to be abandoned in a conventional approach.

Another issue that is illustrated by FIG. 2, considering only cells A and B for explanatory purposes, is that the available storage ranges of cells "A" and "B" have only a small overlap of common resistances. The conventional system that defines a common resistance threshold within overlapping portions of the available storage ranges of the cells would have to have threshold resistance below maximum resistance value 46a of cell "A" and above minimum resistance value 44b of cell "B". This would only allow for resistances to be used for data representation in the overlapping ranges between maximum resistance value 46a and minimum resistance value 44b. Accordingly, this wastes all of the resistance values in cell "A" below the minimum resistance value and all of the resistance values in cell "B" above maximum resistance value 46a.

Figure 3:
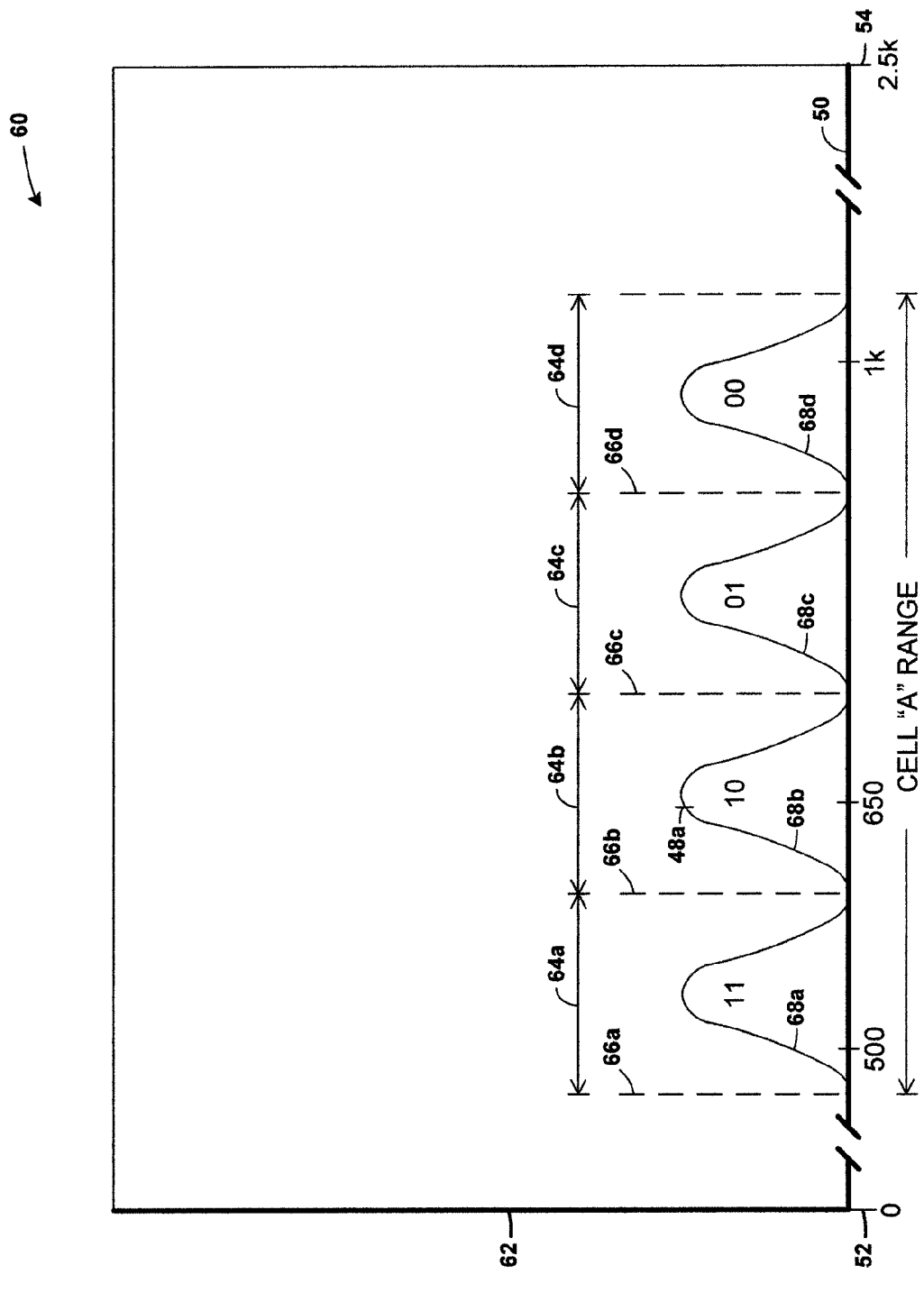
FIG. 3 is a graph illustrating a data scheme for a selected one of the memory cells shown in FIGS. 1 and 2.

Turning now to FIG. 3, cells 26 can be defined to have two or more datum ranges to represent data as shown in a cell distribution graph 60. Graph 60 shows a distribution axis 62 of the probability of programmed parameter values plotted against potential parameter value range 50 of the array of cells which extends from minimum potential parameter value 52 to maximum potential parameter value 54. Available storage range 42a of cell "A" is shown within potential parameter value range 50. Cell "A" can be used, by way of example, for storing four different datum values, which can represent, e.g., two bits of information, such as 00, 01, 10, or 11. Cell "A" is shown divided into four datum ranges 64a-64d, each of which is 25% of the total available storage range of cell "A". While two bits of data are used in FIG. 3 for discussion purposes, the available storage range of cell "A" or other cells can be divided into more datum ranges to represent more data. The available storage range can be divided up by percentages, to a quadratic, log function, or in another suitable manner by which certain datum ranges of the available storage range represent different datum values.

As shown in FIG. 3, cell "A" includes a datum range 64a that extends from a threshold 66a to threshold 66b. The thresholds are specific resistance values that can be used to define the datum ranges 64 used for representing a specific datum value. For example, datum range 64a can be used to represent datum value "11". In this situation, a parameter having a current value within datum range 64a can be interpreted as representing datum value "11". Specific parameter values falling within datum range 64a over time during multiple programming and erasing cycles of the cell can produce a distribution curve 68a which corresponds to the probability of the occurrence of each resistance within the datum range 64a and is generally Gaussian.

A datum range 64b extends from threshold 66b to threshold 66c; a datum range 64c extends from threshold 66c to threshold 66d; and a datum range 64d extends from threshold 66d to threshold 66e. Datum range 64b can represent datum value "10"; datum range 64c can represent datum value "01"; and datum range 64d can represent datum value "00". Distribution curves 68b, 68c and 68d represent specific parameter values falling within datum ranges 64b, 64c and 64d, respectively, during multiple programming and erasing cycles of the cell. The datum ranges can be assigned to represent any of the datum values shown or other datum values in one or more data schemes. The data schemes can be stored in memory 20 or other suitable memory that is accessible by the controller. The data scheme can be used to correlate the position of a current parameter value within an available storage range with a specific datum value, including for cells divided by percentages and other divisions of the available storage ranges.

As shown in FIG. 2 in conjunction with FIG. 3, specific parameter value 48a falls within datum range 64b between threshold 66b and threshold 66c. Therefore, in the present embodiment, specific parameter value 48a represents a datum value "10".

Figure 4:
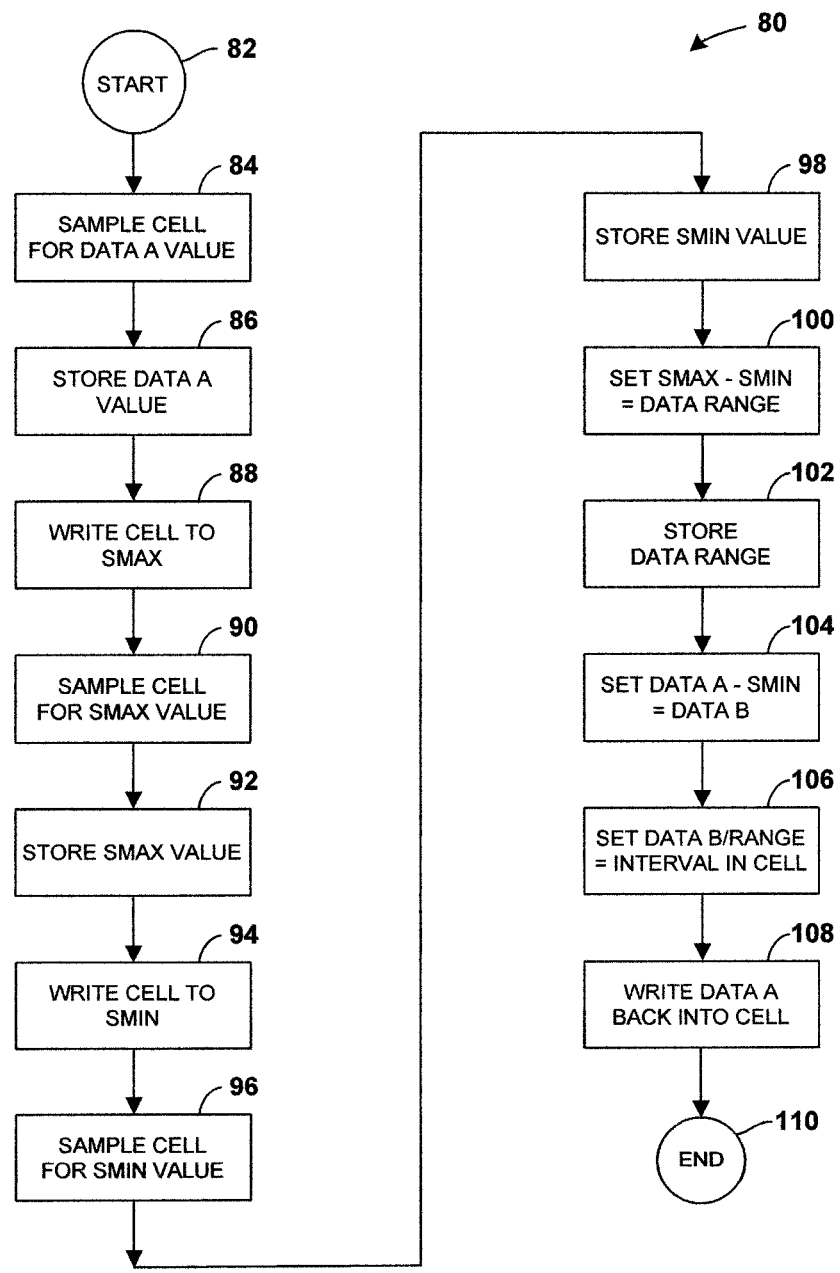
FIG. 4 is a flow diagram illustrating an embodiment of a method for the operation of the memory device of FIG. 1 to read data from the memory cells of the memory device.

Referring now to FIG. 4, a method 80 for reading data from an array of memory cells having varying available storage ranges according to an embodiment of the present disclosure is illustrated. For purposes of this example embodiment, data can be read from cell "A" 26a that has already been programmed to parameter value 48a, which can be referred to as data A. Method 80 could be applied to any selected one of cells 26 to determine the position of the current value of the parameter within the available storage range of the selected cell. Method 80 can be accomplished using apparatus 10 in FIG. 1. Method 80 begins at start 82 and proceeds to act 84 where the cell is sensed to determine the current value 48a of the parameter of the cell ("data A"). The cell can be sensed using sensor 16 in controller 12 which can access the cells for sensing through interface 24. Sensor 16 can be a current sensor which determines the current resistance of the cell by supplying a current through the cell. The sensor can be controlled using processor 14 which can be used to determine which cell to read and when to read the cell, among other operations. In the present embodiment, "data A" is 650 Ohms.

Following act 84, method 80 proceeds to act 86 where "data A", the determined current value 48a of the parameter is stored in memory. The current value of the parameter can be stored in memory 20 in the controller which can be a temporary memory cache or other suitable memory that is accessible to controller 12 (e.g., including a portion of the array of memory cells). Memory 20 can be digital memory or can be analog storage yet to be described.

Following act 86, method 80 proceeds to act 88, where the cell is programmed to the maximum resistance value of the available storage range of the cell, which for cell "A" is maximum resistance value 46a (shown as 1.1 k Ohms). In this act, processor 14 can control programmer 18 to drive the cell until the cell no longer responds by increasing in resistance. Depending on the technology, the programmer may apply a maximum drive current, voltage, radiation (e.g., visible light, infrared or thermal radiation) or other programming parameter or parameters. Following act 88, method 80 proceeds to act 90 where the maximum resistance value is sensed from the cell. The maximum resistance value can be sensed using sensor 16. In this instance, maximum resistance value 46a is sensed and the value can be referred to as "smax." Following act 90, method 80 proceeds to act 92 where the value of smax is stored. In this act smax can be stored in memory 20 in controller 12 or in some other suitable memory that is accessible to controller 12.

Following act 92, method 80 proceeds to act 94 where cell "A" is programmed to a minimum resistance value of the available storage range of the cell. For cell "A", the minimum resistance value for the available storage range is minimum resistance value 44a (shown as 450 Ohms). The processor can control programmer 18 to drive the cell until the cell reaches the minimum resistance. In an embodiment where the cells are MRAM, the programmer can use a drive current in one direction to program the cell to the maximum resistance value and a drive current in the opposite direction to program the cell to the minimum resistance value. For a particular technology, there can be minimums specified for the drive variables, which can be provided by a manufacturer.

Following act 94, method 80 proceeds to act 96 where the minimum resistance value is sensed from the cell. Minimum resistance value 44a can be sensed using sensor 16 and can be referred to as "smin." Following act 96, method 80 proceeds to act 98 where the value of smin is stored. The value smin can be stored in memory 20 in controller 12 or in some other suitable memory that is accessible to controller 12.

Method 80 then proceeds to act 100 where the available storage range of cell "A" is determined. In this act, smin is subtracted from smax to determine available storage range 42a for cell "A". The available storage range can be referred to as "data range". In the present embodiment, subtracting smin (450) from smax (1.1 k) produces a data range value of 650. The data range can be determined using processor 14 in controller 12, such as by accessing the stored values of smin and smax from memory. Method 80 then proceeds to act 102 where the value of the data range is stored. The value of the data range can be stored in memory 20 in controller 12 or in some other suitable memory that is accessible to controller 12.

Following act 102, method 80 proceeds to act 104 where the position of the determined current value 48a of the parameter within the available storage range 42 can be determined, such as by subtracting smin from "data A" to produce a value "data B" which is related to the position. In the present embodiment, subtracting smin (450) from "data A" (650)

produces "data B" with a value of 200 within the range of 650. Processor 14 can perform the calculation and can access memory 20 for stored values.

In the embodiment shown in method 80, the position of the determined current value 48a ("data A") of the parameter within the available storage range ("data range") can be specified as a percentage of the available storage range. For this purpose, method 80 proceeds to act 106 following act 104. In act 106, the value of "data B" is divided by the value of "data range" to produce the percentage interval of "data A" in the cell. In the present embodiment, dividing "data B" (200) by "data range" (650) produces 0.307 or about 31%. As can be seen in FIG. 3, the value 31% places the current value 48a of the parameter in datum range 64b, which represents datum value "10". Following act 106, the determined value 48a of the parameter can be retrieved from memory and rewritten back into the cell in act 108. Following act 108, method 80 ends at act 110. The acts of method 80 do not necessarily have to be performed in the illustrated order, for instance, acts 94, 96 and 98 could be performed prior to acts 88, 90 and 92.

Method 80 can be performed for any of the cells 26 in memory device 10. Since each of the cells can have a different available storage range, the parameters determined can vary from cell to cell. However, using method 80, the full available storage ranges of the cells can be used regardless of the fact that the available storage ranges vary.

Figure 5:
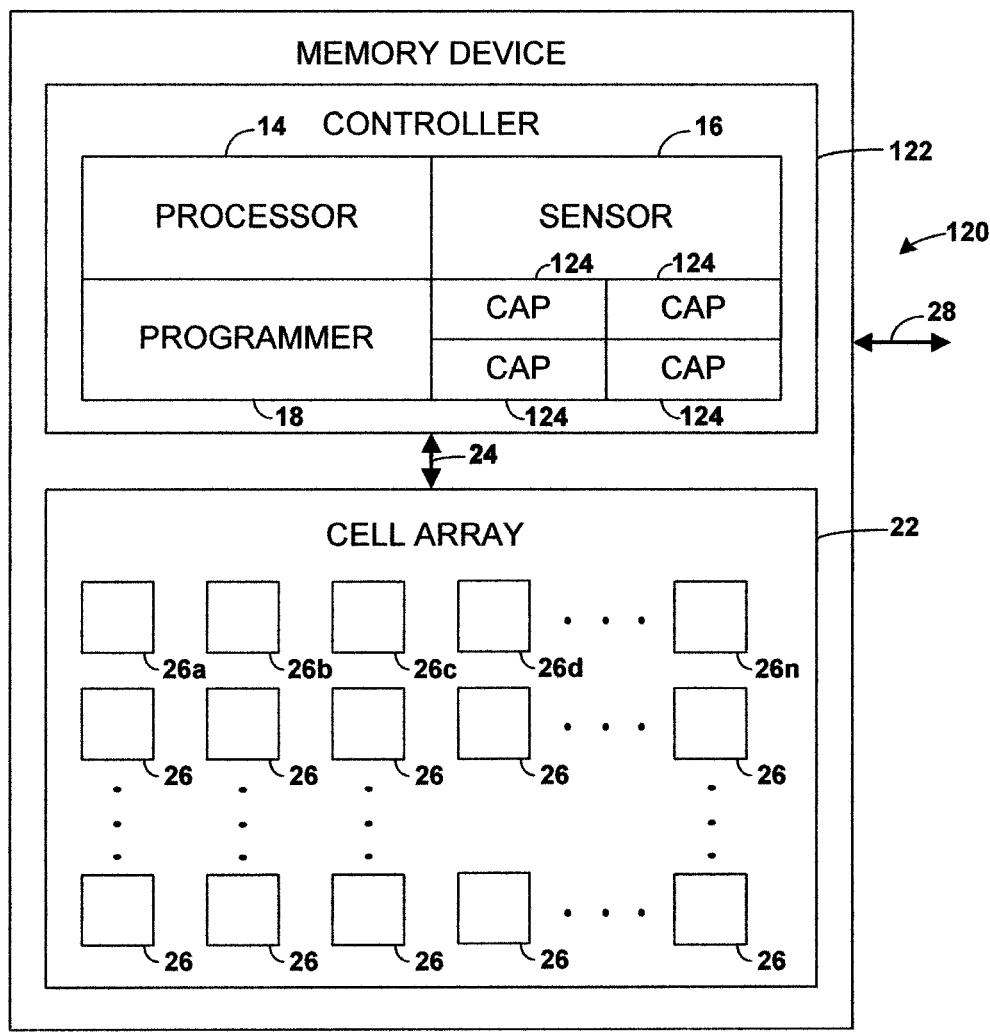
FIG. 5 is a block diagram which illustrates another memory device having memory cells with non-stable references that is arranged according to another embodiment of the present disclosure.

Referring now to FIG. 5, analog storage 124 can be used for the memory in the controller. The analog storage can be capacitors, which can be used to temporarily store values using a variable charge level to represent "data A" and other values. A controller 122 in memory device 120 in FIG. 5 can also include other components necessary to utilize the analog storage as would be understood by one of ordinary skill in the art.

Figure 6:
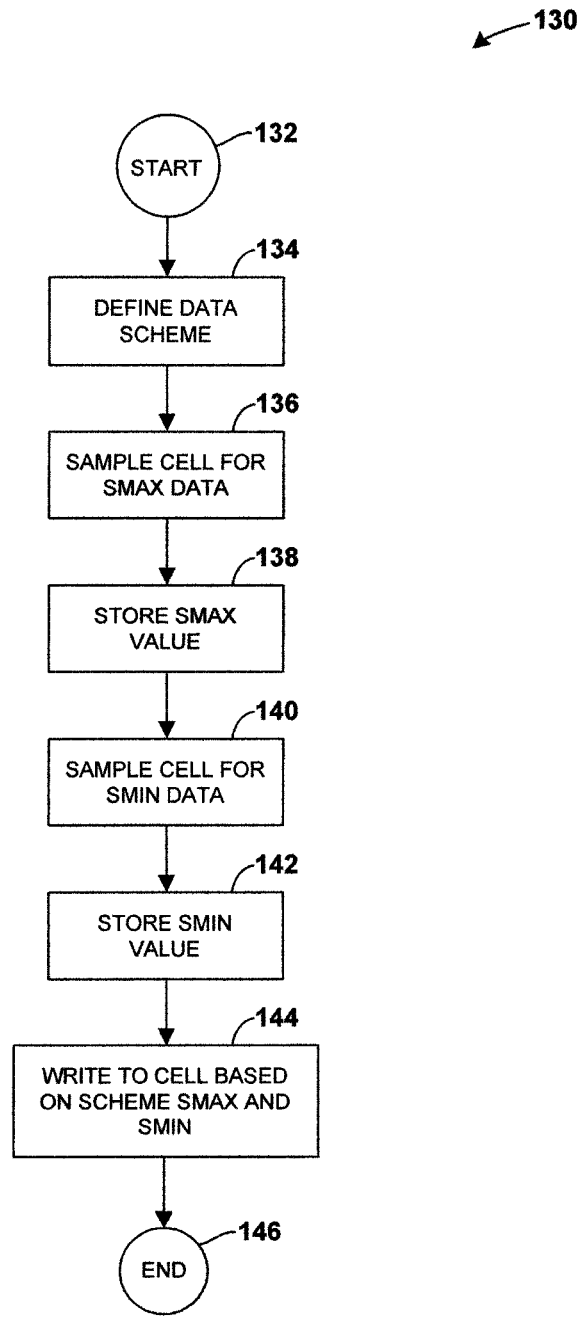
FIG. 6 is a flow diagram illustrating an embodiment of another method for operation of the memory device to program memory cells.

Referring now to FIG. 6, a method 130 for programming data to an array of memory cells having varying available storage ranges according to an embodiment of the present disclosure is illustrated. Method 130 begins at a start 132 and then proceeds to act 134. At act 134, a data scheme is defined for the cell or cells to be programmed. The data scheme can correlate datum ranges of the available storage range to different datum values. The data scheme can be stored in the controller memory or other memory and can be defined by the manufacturer or user of the memory device. Following act 134, method 130 proceeds to act 136 where the maximum available parameter value is determined for a cell. This parameter value can be determined by the sensor in the controller and in the instance of MRAM can be the maximum available resistance value of a particular cell.

Following act 136, method 130 proceeds to act 138 where the maximum available parameter value can be stored in memory as "smax". Following act 138, method 130 proceeds to act 140 where the minimum available parameter value is determined for the cell. The minimum available parameter value can also be determined by the sensor in the controller. Following act 140, method 130 proceeds to act 142 where the minimum available parameter value can be stored as "smin". Following act 142, method 130 proceeds to act 144 where the data scheme, "smax" and "smin" are used to determine the value of the specific parameter value to be programmed to the cell.

In the depicted embodiment, which can be understood by reference to FIGS. 2 and 3 in conjunction with FIG. 6, a data scheme is defined where cell "A" is to be used to store two bits of data and each bit of data is represented by 25 percent of the available storage range of the cell. Also in this embodiment, as shown in FIG. 3, the lowest resistance 25 percent (datum range 64a) represents datum "11"; the second lowest resistance 25 percent (datum range 64b) represents datum "10"; the second highest resistance 25 percent (datum range 64c) represents datum "01"; and the highest resistance 25 percent (datum range 64d) represents "00". If datum value "10" was selected to be programmed to cell "A" the cell is programmed to a respective resistance value that falls within datum range 64b, such as resistance value 48a. Programming the cell can be accomplished using "smax" and "smin" to determine the available range of the cell, dividing the cell into the percentages and programming the cell using the percentages to a resistance within the available range. Method 130 proceeds to act 146 following act 144 where the method ends.

The foregoing description of the invention has been presented for purposes of illustration and description. It is not intended to be exhaustive or to limit the invention to the precise form or forms disclosed, and other modifications and variations may be possible in light of the above teachings wherein those of skill in the art will recognize certain modifications, permutations, additions and sub-combinations thereof.

What is claimed is:

1. A method for use with respect to an array of memory cells, wherein each memory cell of the array has a parameter that can be programmed to any value within an available storage range of the cell having a continuous range of available storage values, wherein the available storage range for at least one of the memory cells of the array has a different continuous range of available storage values than at least another one of the memory cells of the array, said method comprising:
    determining a current value of the parameter of a selected memory cell of the array corresponding to one of the available storage values in the continuous range of available storage values within the available storage range of the selected cell; and
    determining a position of the determined value of the parameter within the available storage range of the selected memory cell.

2. A method as defined in claim 1, further comprising:
    determining a data value stored in the selected cell based at least in part on the determined position of the determined value within the available storage range of the selected cell.

3. A method as defined in claim 2 wherein determining a position of the determined value within the available storage range includes determining a magnitude of the available storage range of the selected cell, wherein the magnitude of the available storage range comprises a difference between a minimum value of the parameter of the selected cell and a maximum value of the parameter of the selected cell.

4. A method as defined in claim 3, further comprising determining the minimum value of the parameter of the selected cell.

5. A method as defined in claim 1 wherein the selected cell is one of a plurality of cells of the memory array that each have a different available storage range from one another, wherein:
    determining a current value of the parameter of a selected cell of the array comprises determining a current value of the parameter for each of the plurality of cells;
    determining a position of the determined value within the available storage range of the selected cell comprises, for each of the plurality of cells, determining a position of the determined value within the available storage range of the cell; and determining data values stored in the plurality of cells based at least in part on the determined positions of the determined values within the available storage ranges of the plurality of cells.

6. A method as defined in claim 5 wherein determining positions of the determined values within the available storage ranges of the plurality of cells comprises, for each of the plurality of cells, determining a minimum value of the parameter of the cell.

7. A method as defined in claim 6 wherein determining positions of the determined values within the available storage ranges of the plurality of cells further comprises, for each of the plurality of cells, determining a maximum value of the parameter of the cell.

8. A method as defined in claim 7 wherein determining positions of the determined values within the available storage ranges of the plurality of cells further comprises, for each of the plurality of cells, determining a difference between the maximum value of the parameter of the cell and the minimum value of the parameter of the cell, and wherein, for each of the plurality of cells, the available storage range of the cell comprises the difference between the maximum value of the parameter of the cell and the minimum value of the parameter of the cell.

9. A method as defined in claim 1, further comprising:
using a data scheme associated with the array to correlate a datum value with the determined position.

10. A method as defined in claim 9, wherein the data scheme divides the available storage range into datum ranges, wherein each of the datum ranges represents a different datum value.

11. A method as defined in claim 10 wherein the data scheme divides the available storage range into data ranges by percentages.

12. An apparatus comprising:
an array of memory cells, wherein each memory cell of the array has a parameter that can be programmed to any value within an available storage range of the cell, having a continuous range of available storage values, wherein the available storage range for at least one of the memory cells of the array has a different continuous range of available storage values than at least another one of the memory cells of the array; and
a controller coupled to the array of memory cells, wherein the controller is configured to:
determine a current value of the parameter of a selected memory cell of the array; and
determine a position of the determined value of the parameter within the available storage range of the selected memory cell.

13. An apparatus as defined in claim 12, wherein the controller is configured to determine the position of the determined value of the parameter at least partially by determining a minimum value and a maximum value of the available storage range of the selected cell.

14. An apparatus as defined in claim 13, wherein the array of memory cells comprises an array of magnetoresistive random access memory (MRAM) cells and the parameter comprises a cell resistance, and wherein the controller is configured to determine the minimum value of the available storage range by determining a minimum resistance of the selected cell and to determine the maximum value of the available storage range by determining a maximum resistance of the selected cell.

15. An apparatus as defined in claim 12, wherein the controller is configured to access a memory configured to store a data scheme for the array of memory cells in which datum values are correlated with positions within the available storage range, wherein the memory is accessible to determine a specific datum value correlated to the determined position.

16. An apparatus as defined in claim 12, wherein the controller being configured to determine a position of the determined value of the parameter within the available storage range of the selected memory cell comprises the controller being configured to determine a percentage value of the selected memory cell at least partially from the determined position of the determined value of the parameter within the available storage range of the selected cell and the controller is configured to access a memory configured to store a data scheme for the array of memory cells in which datum values are correlated with percentage values of programmed parameter values within the available storage range, wherein the memory is accessible to determine a specific datum value correlated to the determined percentage value of the selected memory cell.

17. An apparatus as defined in claim 12, wherein the apparatus comprises an analog to digital converter configured to determine the current value of the parameter of the selected cell.

18. An apparatus as defined in claim 12, wherein the array of memory cells comprises an array of magnetoresistive memory cells and the parameter of the selected cell comprises resistance.

19. An apparatus as defined in claim 12, wherein the array of memory cells comprises phase change memory cells and the parameter of the selected cell comprises resistance.

20. An apparatus as defined in claim 12, wherein the array of memory cells comprises an array of resistive memory cells and the parameter of the selected cell comprises resistance.

21. A method for reading data from a memory cell, said method comprising:
determining a current value of a parameter of the cell;
determining a minimum value of the parameter of the cell;
determining a maximum value of the parameter of the cell;
determining an available storage range of the cell based on the minimum value and the maximum value of the parameter of the cell;
determining a position of the determined current value of the parameter of the cell within the determined available storage range of the cell; and
determining a datum value based at least in part on the determined position of the determined current value of the parameter of the cell within the determined available storage range of the cell.

22. A method for use with respect to an array of memory cells, wherein each memory cell of the array has a parameter that can be programmed to any value within an available storage range of the cell having a continuous range of available storage values, wherein the available storage range for at least one of the memory cells of the array has a different continuous range of available storage values than at least another one of the memory cells of the array, said method comprising:
determining the available storage range of a selected memory cell of the array; and
programming the parameter of the selected memory cell to a respective value based at least in part on the determined available storage range of the selected cell.

23. The method as defined in claim 22, wherein programming the parameter of the selected memory cell to a respective value based at least in part on the determined available storage range of the selected memory cell comprise programming the parameter of the selected memory cell to a respective value based at least in part on the determined available storage range of the selected memory cell and a defined data scheme.

24. An apparatus comprising:
an array of memory cells, wherein each memory cell of the array has a parameter that can be programmed to any value within an available storage range of the cell having a continuous range of available storage values, wherein the available storage range for at least one of the memory cells of the array has a different continuous range of available storage values than at least another one of the memory cells of the array; and
a controller coupled to the array of memory cells, wherein the controller is configured to:
determine the available storage range of a selected memory cell of the array; and
program the parameter of the selected memory cell to a respective value based at least in part on the determined available storage range of the selected cell.

25. The method as defined in claim 1, wherein the available storage range of the selected memory cell includes a minimum storage value and a maximum storage value and the position of the determined value of the parameter is determined within the available storage range of the selected memory cell relative to the minimum storage value and the maximum storage value.

26. The apparatus as defined in claim 12, wherein the available storage range of the selected memory cell includes a minimum storage value and a maximum storage value and the controller is configured to determine the minimum storage value and the maximum storage value and to determine the position of the determined value of the parameter within the available storage range of the selected memory cell relative to the minimum storage value and the maximum storage value.

27. The method as defined in claim 21, wherein the position of the determined current value of the parameter of the cell is determined within the available storage range of the selected memory cell relative to the minimum parameter value and the maximum parameter value.

28. The method as defined in claim 21, wherein the available storage range is a continuous range of the parameter from the minimum value of the parameter to the maximum value of the parameter.

29. The method as defined in claim 22, wherein the available storage range of the selected memory cell includes a minimum storage value and a maximum storage value and the parameter of the selected memory cell is programmed to the respective value relative to the minimum available storage value and the maximum available storage value.

30. The apparatus as defined in claim 24, wherein the available storage range of the selected memory cell includes a minimum storage value and a maximum storage value and the controller is configured to determine the minimum storage value and the maximum storage value of the determined available storage range and to program the parameter to the respective value relative to the minimum storage value and the maximum storage value.

* * * * *